United States Patent [19]
Shimada

[11] Patent Number: 5,786,241
[45] Date of Patent: Jul. 28, 1998

[54] METHOD FOR FORMING A THIN FILM SEMICONDUCTOR DEVICE UTILIZING A GATE AND GATE SIDE WALLS AS MASKS

[75] Inventor: Hiroyuki Shimada, Kanagawa, Japan

[73] Assignee: Semiconductor Energy Laboratory Co., Ltd., Kanagawa, Japan

[21] Appl. No.: 365,116

[22] Filed: Dec. 28, 1994

[30] Foreign Application Priority Data

Jan. 8, 1994 [JP] Japan .................. 6-012151

[51] Int. Cl.$^6$ .................................. H01L 21/84
[52] U.S. Cl. .............. 438/163; 438/149; 438/596
[58] Field of Search ............. 437/40 TFT, 41 TFT, 437/913, 21, 44, 40 SW, 41 SW; 148/DIG. 150; 438/163, 149, 596

[56] References Cited

U.S. PATENT DOCUMENTS

| | | | |
|---|---|---|---|
| 4,946,799 | 8/1990 | Blake et al. | 437/913 |
| 5,013,675 | 5/1991 | Shen et al. | 437/44 |
| 5,015,595 | 5/1991 | Wollesen | 437/44 |
| 5,066,613 | 11/1991 | Reedy et al. | 437/913 |
| 5,292,675 | 3/1994 | Codama | 437/41 TFT |
| 5,424,230 | 6/1995 | Wakai | 437/40 TFT |

FOREIGN PATENT DOCUMENTS

| | | | |
|---|---|---|---|
| 5226648 | 9/1993 | Japan | |
| 6232160 | 8/1994 | Japan | 437/21 |

OTHER PUBLICATIONS

Zhao et al, "A Novel Floating Gate Spacer Polysilicon", IEDM, Dec. 5–8, 1993, pp. 393–395.

*Primary Examiner*—Michael Trinh
*Attorney, Agent, or Firm*—Sixbey, Friedman, Leedom & Ferguson; Gerald J. Ferguson, Jr.; Jeffrey L. Costellia

[57] ABSTRACT

In a thin film transistor (TFT) having an active layer formed on an insulating film, a gate electrode is formed by using a metal material such as aluminum, an gate insulating film is formed by using a silicon insulator such as silicon oxide or silicon nitride. A film is formed on the gate electrode and the gate insulting film by using a silicon material such as amorphous silicon and then etched with anisotropic etching to form side walls made of a silicon material in sides of the gate electrode. In this etching, since an etching rate of the side walls is larger than that of the gate insulating film, the gate insulating film is not almost etched.

24 Claims, 3 Drawing Sheets

METHOD FOR FORMING A THIN FILM SEMICONDUCTOR DEVICE UTILIZING A GATE AND GATE SIDE WALLS AS MASKS

BACKGROUND OF THE INVENTION

1. Field of the Invention

The present invention relates to an MIS (Metal-Insulator-semiconductor) type semiconductor device, that is, a thin film transistor (TFT) which has a thin film active layer and is formed on an insulating material such as a glass or on an insulating surface which an insulating film such as a silicon oxide is formed on a silicon wafer, and a method for manufacturing the TFT. The semiconductor device of the present invention is used in, in particular, an active matrix circuit of a liquid crystal display device or the like, a driving circuit of an image sensor or the like, or 3 dimensional integrated circuit.

2. Description of the Related Art

Recently, in order to drive an active matrix type liquid crystal display device, an image sensor or the like, it is well known that a thin film transistor (TFT) is formed. In particular, in order to perform high speed operation, in stead of an amorphous silicon TFT which amorphous silicon is used in an active layer, a crystalline silicon TFT which has an electric field mobility higher than that of the amorphous silicon TFT is developed. In order to obtain a further high grade characteristic and high reliability, it is necessary to form a low concentration impurity region (lightly doped drain, LDD) used in a semiconductor integrated circuit technique. However, since a TFT forming technique is different from a known semiconductor integrated circuit technique, there are many problems which must be solved.

FIGS. 3A to 3E show commonly used processes for forming a TFT having a LDD. A base film 302 is formed on a substrate 301. An active layer is formed using a crystalline silicon 303 on the base film 302. An insulating film 304 as a gate insulating film is formed using a material such as a silicon oxide on the active layer. (FIG. 3A)

A gate electrode 305 is formed using a polycrystalline silicon (which an impurity such as phosphorus is doped), tantalum, titanium, aluminum or the like. Using the gate electrode 305 as a mask, an impurity element (phosphorus or boron) is introduced by an ion doping or the like, to form low concentration impurity regions 306 and 307 in which a doping dose is less in the active layer 303 in a self-alignment. A region of the active layer 303 which the impurity is not introduced and positioned under the gate electrode 305 is used as a channel forming region. An insulating film 308 such as a silicon oxide is formed by a plasma CVD (Chemical Vapor Deposition), APCVD (atmosphere pressure CVD), or the like. (FIG. 3B)

After that, by anisotropic etching the insulating film 308, side walls 309 are formed adjacent to side surfaces of the gate electrode 305. (FIG. 3C)

Again, an impurity is introduced by an ion doping or the like using the gate electrode 305 and the side walls 309 as mask, to form high concentration impurity regions (source and drain regions) 310 and 311 in a self-alignment. Simultaneously, low concentration impurity regions 312 and 313 adjacent to the source and drain regions 310 and 311 are determined. (FIG. 3D)

By thermal annealing or annealing with a laser or a heating source such as a flash lamp, the doped impurity is activated. An interlayer insulator 314 is formed and then etched to form contact holes in the source and drain region 310 and 311. Further, by using a metal material such as aluminum, wirings-electrodes 315 and 316 connecting with the source and drain regions 310 and 311 are formed. (FIG. 3E)

Since the above processes are the same processes as a LDD forming process for a conventional semiconductor integrated circuit, and there is a process which is difficult to use in a process for forming a TFT on a glass substrate and a process which is not preferred in productivity.

A most important problem is as follows. That is, since a selection ratio of etching between the side walls and a gate insulating film is extremely small, the gate insulating film is also etched in etching process for forming the side walls. In particular, although a thickness of a film used to form the side walls almost coincides with a thickness (height) of the gate electrode and is 3000 Å to 1 μm, a thickness of the gate insulating film is 500 to 1500 Å, so that it is difficult to uniformly control an overetching depth x for the gate insulating film in all the substrates.

As a result, when the source and drain regions are formed in a doping process (FIG. 3D), by a thickness deviation of a gate insulating film between a plurality of substrates or a thickness deviation of a gate insulating film in the same substrate, a dose changes. To solve this problem, it is considered that a gate insulating film is also etched in the above etching process, to expose an active layer. However, since a thickness of an active layer in a TFT is 200 to 2000 Å, preferably 200 to 1000 Å and the active layer is thin, etching of the active layer in an etching process for a gate insulating film can be neglected. If the active layer is etched, it is a cause that a sheet resistance of the source and drain regions gets high and an inferior contact produces.

SUMMARY OF THE INVENTION

An object of the present invention is to solve the above problems. In the present invention, a material containing mainly silicon such as amorphous silicon is used to from side walls, and a metal material such as aluminum, tantalum, or titanium is used to from a gate electrode. The gate insulating film is formed by using silicon oxide, silicon nitride or a compound film of the silicon oxide and the silicon nitride.

According to the present invention, there is provided a method for forming a thin film semiconductor device comprising the steps of: forming a semiconductor film on a substrate having an insulating surface; forming a gate insulating film having a first etching rate on the semiconductor film; forming a gate electrode having a metal on the gate insulating film; introducing an impurity using the gate electrode as a mask, to form impurity regions; forming side walls having a second etching rate in sides of the gate electrode from a film having silicon; and introducing an impurity providing the same conductivity type as the impurity regions into the impurity regions using the side walls as a mask, wherein the second etching rate is larger than the first etching rate.

DETAILED DESCRIPTION OF THE PREFERRED EMBODIMENTS

Figure 1A:
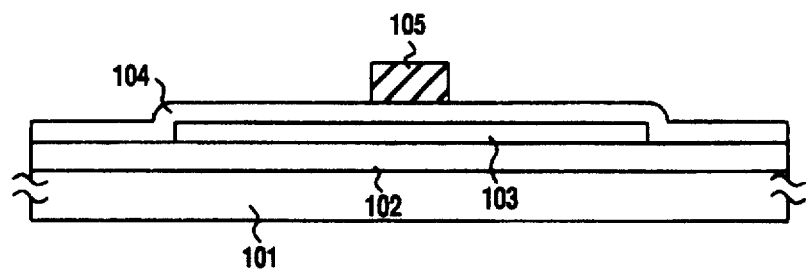
FIGS. 1A to 1E show a thin film transistor (TFT) forming process according to an embodiment of the present invention.

According to the present invention, in etching for forming side walls, a selection ratio of etching between a side wall material and a gate insulating film material can be large sufficiently. That is, an etching rate of the side wall material is sufficiently larger than that of the gate insulating film material. Therefore, a problem with respect to an overetching of a gate insulating film is solved. Also, after a lightly doped drain (LDD) is formed, side walls are not required. In general, since the side walls and the gate insulating film are formed by the same material, it is difficult to remove only the side walls. However, in the present invention, the side walls can be removed after the LDD is formed, and then laser annealing or the like can be performed, thereby to increase productivity.

[EMBODIMENT 1]

FIGS. 1A to 1E show a thin film transistor (TFT) forming process according to an embodiment of the present invention. By a sputtering in an atmosphere containing oxygen, a silicon oxide film having a thickness of 1000 to 3000 Å, for example, 2000 Å, is formed as a base oxide film 102 on a substrate 101. In order to increase productivity, in stead of the silicon oxide film, a film formed by decomposing and depositing a TEOS by a plasma CVD (chemical vapor deposition) may be used. The substrate 101 is a product of NH technoglass company Co.Ltd, NA35, and has 300 mm×400 mm, or 100 mm×100 mm in size.

An amorphous silicon film having a thickness of 200 to 2000 Å, preferably 400 to 1000 Å, is deposited by a plasma CVD and a low pressure CVD (LPCVD), and leaved at 550° to 650° C. for 24 hours in a reducing atmosphere to crystallize it. Crystallization may be performed by laser irradiation. The crystallized silicon film is patterned to form an island-like region 103. A silicon oxide film 104 having a thickness of 700 to 1500 Å is formed as a gate insulating film on the island-like region 103 by a sputtering or a plasma CVD.

An aluminum film (containing Si of 1 weight % or Sc (scandium) 0.1 to 0.3 weight %) having a thickness of 3000 Å to 1 μm, for example, 6000 Å, is formed by an electron beam evaporation or a sputtering and patterned and etched to form a gate electrode 105. (FIG. 1A)

By an ion doping, an impurity is introduced into the active layer 103 of the TFT using the gate electrode 105 as a mask in a self-alignment, to form impurity regions 106 and 107. Since a doping gas is phosphine ($PH_3$), the regions 106 and 107 are an N-type impurity region. In order to form a P-type impurity region, diborane ($B_2H_6$) may be used as a doping gas. A dose is $1\times10^{13}$ to $5\times10^{14}$ $cm^{-2}$, for example, $5\times10^{13}$ $cm^{-2}$. An accelerating energy is 80 to 110 keV, for example, 90 keV. This process may be performed by a known ion implantation. In an ion doping, various ions are introduced in an active layer. If this process is performed using an ion implantation apparatus having a mass separating device, only ion having specific mass/charge can be implanted selectively.

Figure 1B:
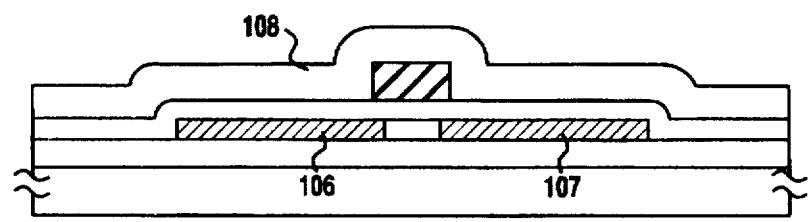

By a plasma CVD, an amorphous silicon film 108 having a thickness of 3000 Å to 1 μm, for example, 6000 Å, is deposited. (FIG. 1B)

Figure 1C:
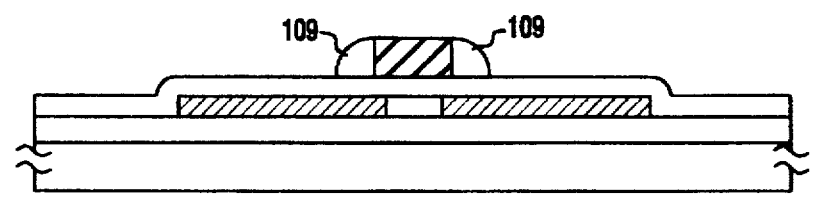

By an anisotropic dry etching, the amorphous silicon film 108 is etched in a vertical direction, so that the side walls 109 remain in sides of the gate electrode 105. In this etching process, the gate insulating film 104 is not almost etched. (FIG. 1C)

Figure 1D:
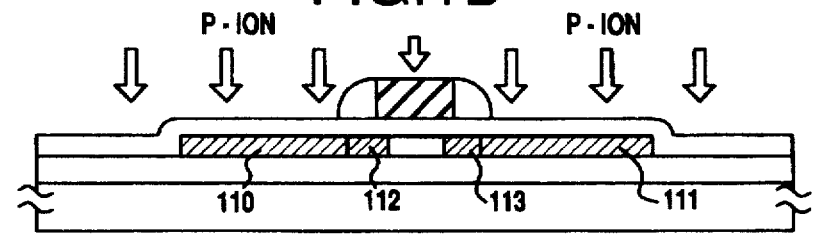

Again, by an ion doping, an impurity having a high concentration is introduced into the active layer 103 of the TFT using the gate electrode 105 and the side walls 109 as masks in a self-alignment, to form source and drain regions 110 and 111. A doping gas is phosphine ($PH_3$). A dose is $1\times10^{14}$ to $5\times10^{15}$ $cm^{-2}$, for example, $1\times10^{15}$ $cm^{-2}$. An accelerating energy is 80 to 110 keV, for example, 90 keV. This process may be performed by a known ion implantation. As a result, the source and drain regions 110 and 111 each having a high impurity concentration and adjacent LDD regions 112 and 113 each having a low impurity concentration are determined. (FIG. 1D)

After the doping process is completed, in the embodiment, the side walls 109 is removed by an isotropic dry etching. The side walls 109 may be not removed.

Figure 1E:
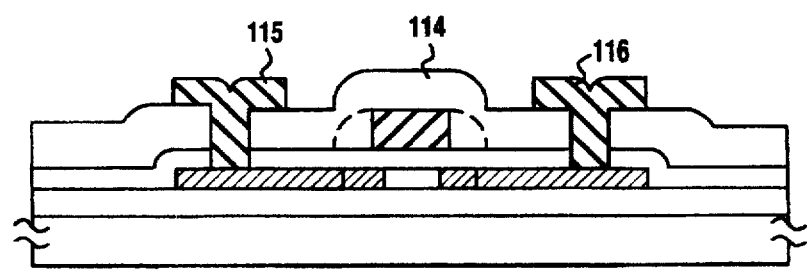

Annealing is performed at 550° to 650° C. for 6 to 24 hours in a reducing atmosphere, to improve crystallinity of the active layer deteriorated by introduction of an impurity. A silicon oxide film having a thickness of 3000 Å is formed as an interlayer insulator 114 on a whole surface By a CVD, contact holes are formed in the source and drain regions 110 and 111 of the TFT, and aluminum wiring-electrodes 115 and 116 are formed. Hydrogen annealing is performed at 200° to 400° C. By the above processes, the TFT is completed. (FIG. 1E)

[EMBODIMENT 2]

Figure 2A:
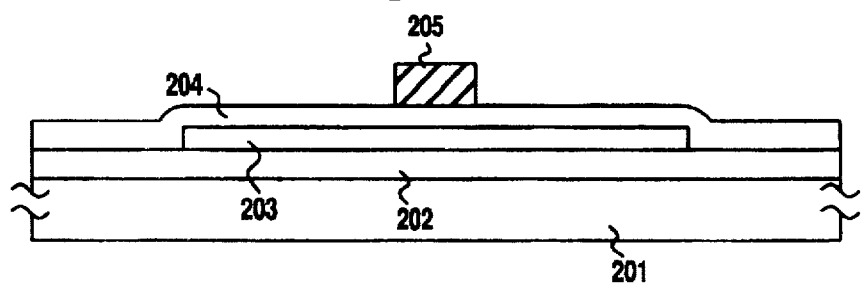
FIGS. 2A to 2E show a TFT forming process according to another embodiment of the present invention.
Figure 2B:
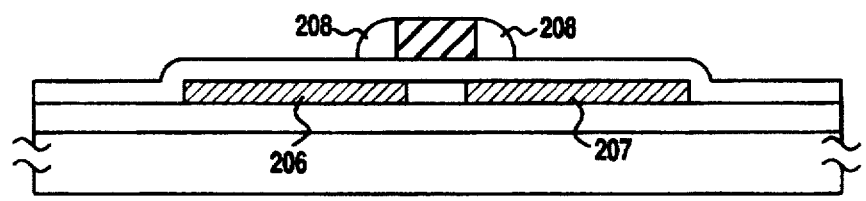

FIGS. 2A to 2E show a TFT forming process according to another embodiment of the present invention. By the same method as used in Embodiment 1, a base oxide film 202, an island-like crystalline silicon region 203, a gate insulating film 204 formed by a silicon oxide film, and a gate electrode 205 formed by an aluminum film having a thickness of 3000 Å to 1 μm, are formed on a glass substrate (Corning 7059). (FIG. 2A)

By an ion implantation, an impurity is introduced into the active layer 203 of the TFT using the gate electrode 205 as a mask in a self-alignment, to form impurity regions 206 and 207. An ion source is phosphorus ion $^{31}P^+$ which mass number is 31. A dose is $1\times10^{13}$ to $5\times10^{14}$ $cm^{-2}$, for example, $5\times10^{13}$ $cm^{-2}$. An accelerating energy is 80 to 110 keV, for example, 90 keV.

By a plasma CVD, an amorphous silicon film having a thickness of 3000 Å to 1 μm, for example, 6000 Å, is deposited. Further, by an anisotropic dry etching, the amorphous silicon film is etched, so that the side walls 208 are formed in sides of the gate electrode 205. (FIG. 1B)

Figure 2C:
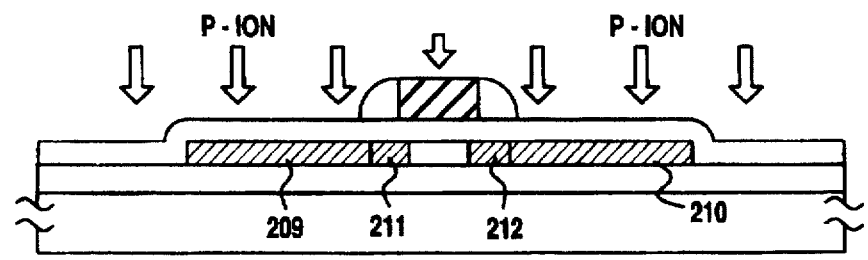

Again, by an ion implantation, an impurity having a high concentration is introduced into the active layer 203 of the TFT using the gate electrode 205 and the side walls 208 as masks in a self-alignment, to form source and drain regions 209 and 210. An ion source is phosphorus ion $^{31}P^+$ which mass number is 31. A dose is $1\times10^{14}$ to $5\times10^{15}$ $cm^{-2}$, for example, $1\times10^{15}$ $cm^{-2}$. An accelerating energy is 80 to 110 keV, for example, 90 keV. As a result, the source and drain regions 209 and 210 each having a high impurity concentration and adjacent LDD regions 211 and 212 each having a low impurity concentration are determined. (FIG. 2C)

Figure 2D:
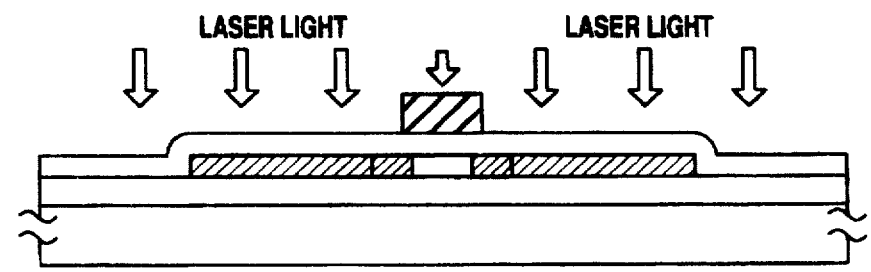

After the doping process is completed, the side walls 208 are removed by an isotropic dry etching. A KrF excimer laser (wavelength of 248 nm and pulse width of 20 ns) is irradiated to activate the doped impurity. It is desired that an energy density of the laser is 200 to 400 $mJ/cm^2$, preferably 250 to 300 $mJ/cm^2$. When a substrate is heated at 200° to 400° C. in laser irradiation, activation efficiency and stability are improved. (FIG. 2D)

In the embodiment, although an excimer laser is used, another laser may be used. It is desired that a pulse laser or the like is used. When a continuous oscillating laser is used, an irradiation period of time is long, so that an object to be irradiated is expanded and peeled by heating.

With respect to a pulse laser, an infrared laser such as an Nd:YAG laser (Q switch pulse oscillation is desired), a visible light such as a second higher harmonics of the infrared laser, and various ultraviolet lasers in which an excimer laser with KrF, XeCl, ArF or the like is used. When a laser is irradiated from an upper surface side of a metal film, it is necessary to select a laser having a wavelength which is not reflected by the metal film. If the metal film is extremely thin, there is no problem. When a laser is irradiated from a substrate side, it is necessary to select a laser which transmits a silicon semiconductor film.

In stead of annealing with laser irradiation, lamp annealing with visible ray irradiation or with near infrared light may be performed. In the lamp annealing, heating is performed that a temperature of an object surface to be irradiated is held at 600° to 1000° C. In 600° C., the lamp irradiation is performed for several minutes. In 1000° C., the lamp irradiation is performed for several ten seconds. Since near infrared ray is selectively absorbed by a silicon semiconductor, a glass substrate is not heated markedly and irradiation time of one shot can be shortened, so that heating to the glass substrate can be suppressed and annealing with near infrared ray (for example, infrared ray having 1.2 μm) is effective.

Figure 2E:
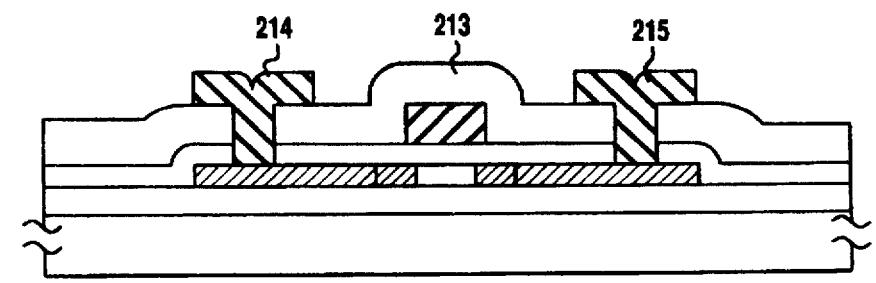
Figure 3A:
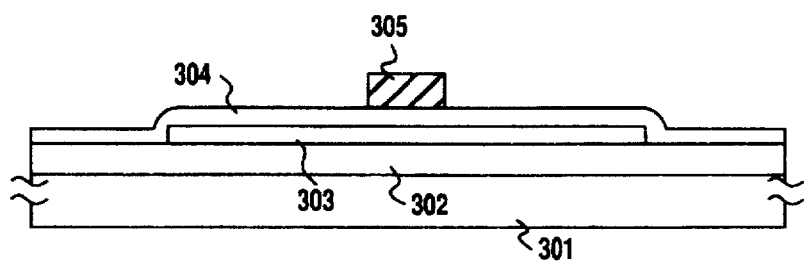
FIGS. 3A to 3E show an example of a TFT forming process.
Figure 3B:
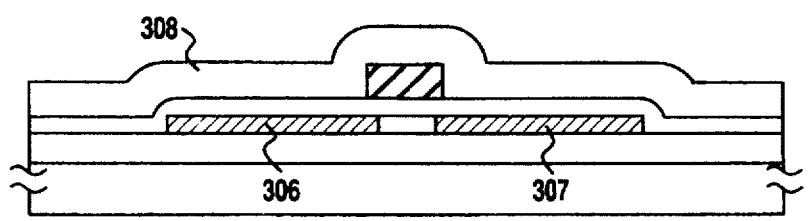
Figure 3C:
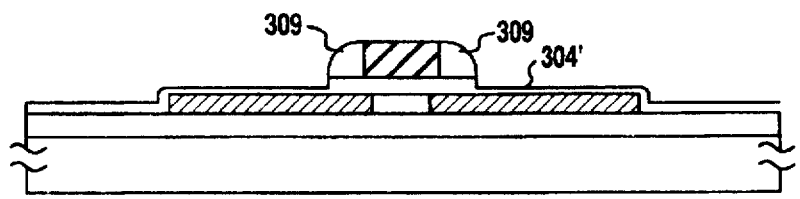
Figure 3D:
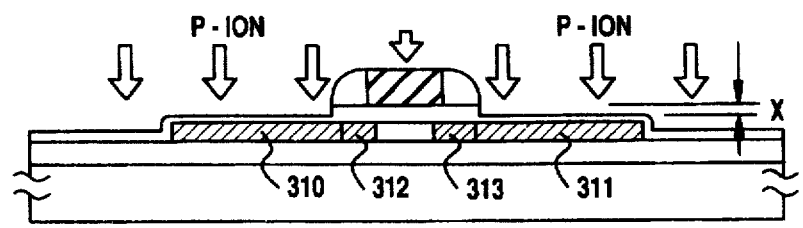
Figure 3E:
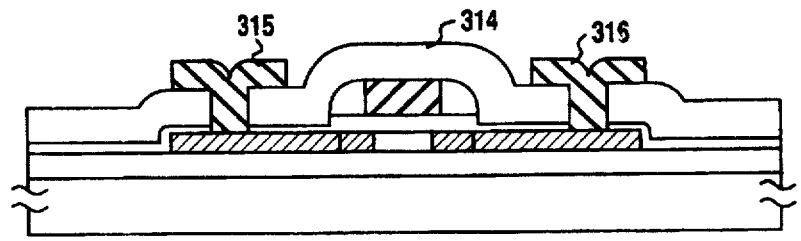

A silicon oxide film having a thickness of 2000 Å to 1 μm, for example, 6000 Å, is formed as an interlayer insulator 213 on a whole surface By a CVD, as shown in FIG. 2E. Contact holes are formed in the source and drain regions 209 and 210 of the TFT. Aluminum wiring-electrodes 214 and 215 are formed by using a film having a thickness of 2000 Å to 5 μm, for example, 8000 Å. When titanium nitride as a barrier metal is formed between the aluminum wiring-electrodes 214 and 215 and the source and drain region 209 and 210, reliability can be further improved.

In the embodiment, activation of the doped impurity is performed by laser annealing. The feature of the present invention is represented in this process. That is, in the present invention, since side walls can be removed, laser annealing is performed only once after the source and drain regions are formed.

In a conventional process, since only side walls cannot be etched and removed. Therefore, first laser annealing is performed after a low concentration impurity is doped, and second laser annealing is performed after the source and drain regions are formed. That is, laser annealing must be performed two times. In the present invention, as described above, since laser annealing is performed only once, productivity can be improved.

In the present invention, since a gate insulating film is not etched in forming side walls, a thickness of the gate insulating film is uniform on a substrate, or between a plurality of substrates, so that a dose of an impurity to be doped with source and drain regions is almost constant, and TFTs each having about the same characteristic can be formed.

In the embodiment, a method for forming a TFT on a glass substrate is described. However, the present invention can be applied to a method for forming a 3 dimensional integrated circuit on a substrate in which a semiconductor integrated circuit is formed or on a glass or an organic resin or the like. The feature of the present invention is to form a TFT or the like on an insulating surface. In particular, the present invention is effective to an electro-optical device such as a monolithic type active matrix circuit which has an active matrix circuit and a peripheral circuit for driving the active matrix circuit on the same substrate.

What is claimed is:

1. A method for forming a thin film semiconductor device comprising the steps of:

forming a semiconductor film on a substrate having an insulating surface;

forming a gate insulating film having a first etching rate on the semiconductor film;

forming a gate electrode including a metal on the gate insulating film;

introducing an impurity, using the gate electrode as a first mask to form impurity regions in the semiconductor film;

forming side walls on sides of the gate electrode having a second etching rate, which is larger than the first etching rate, said side walls comprising an amorphous semiconductive silicon; and introducing an impurity providing the same conductivity type as the impurity regions into the impurity regions using the side walls as a second mask.

2. The method of claim 1 wherein said metal included in the gate electrode is selected from the group consisting of aluminum, tantalum, and titanium.

3. The method of claim 1 wherein the gate insulating film has one of a silicon oxide film, a silicon nitride film, and a compound film of silicon oxide and silicon nitride.

4. A method for forming a thin film transistor, comprising the steps of:

forming a semiconductor film on an insulating surface;

forming a gate insulating film having a first etching rate on the semiconductor film;

forming a gate electrode including a metal on the gate insulating film;

introducing an impurity having a first concentration into the semiconductor film using the gate electrode as a first mask;

forming a side wall forming film in contact with the gate electrode and having a second etching rate, which is larger than the first etching rate;

etching the side wall forming film to form side walls on sides of the gate electrode; and introducing the impurity having a second concentration into the semiconductor film using the gate electrode and the side walls as a second mask to form impurity regions and LDD regions, wherein the side wall forming film is a semiconductor film comprising amorphous silicon.

5. The method of claim 4 wherein said metal included in the gate electrode is selected from the group consisting of aluminum, tantalum, and titanium.

6. The method of claim 4 wherein the gate insulating film has one of a silicon oxide film, a silicon nitride film, and a compound film of silicon oxide and silicon nitride.

7. The method of claim 4 wherein the impurity regions has source and drain regions.

8. The method of claim 7 wherein the LDD regions are formed between the source and drain regions.

9. The method of claim 4 wherein the first concentration is lower than the second concentration.

10. A method for forming a thin film transistor, comprising the steps of:

forming a semiconductor film on an insulating surface;

forming a gate insulating film having a first etching rate on the semiconductor film;

forming a gate electrode including a metal on the gate insulating film;

introducing an impurity having a first concentration into the semiconductor film using the gate electrode as a first mask;

forming a side wall forming film in contact with the gate electrode and having a second etching rate, which is larger than the first etching rate;

etching the side wall forming film to form side walls on sides of the gate electrode;

introducing the impurity having a second concentration into the semiconductor film using the gate electrode and the side walls as masks to form impurity regions and LDD regions;

removing the side walls after the impurity regions and the LDD region are formed; and performing a laser annealing with the impurity region and the LDD regions, wherein the side wall forming film is a semiconductor film comprising amorphous silicon.

11. The method of claim 10 wherein said metal included in the gate electrode is selected from the group consisting of aluminum, tantalum, and titanium.

12. The method of claim 10 wherein the gate insulating film has one of a silicon oxide film, a silicon nitride film, and a compound film of silicon oxide and silicon nitride.

13. The method of claim 10 wherein the impurity regions have source and drain regions.

14. The method of claim 13 wherein the LDD regions are formed between the source and drain regions.

15. The method of claim 13 wherein the first concentration is lower than the second concentration.

16. A method for forming thin film transistor, comprising the steps of:

forming a semiconductor film on an insulating surface;

forming a gate insulating film having a first etching rate on the semiconductor film;

forming a gate electrode including a metal on the gate insulating film;

introducing an impurity into the semiconductor film using the gate electrode as a first mask;

forming side walls having a second etching rate, which is larger than the first etching rate, in contact with sides of the gate electrode; and introducing the impurity into the semiconductor film using the gate electrode and the side walls as a second mask to form impurity regions and LDD regions, wherein said side walls comprises an amorphous semiconductive silicon.

17. The method of claim 16 wherein said metal included in the gate electrode is selected from the group consisting of aluminum, tantalum, and titanium.

18. The method of claim 16 wherein the gate insulating film has one of a silicon oxide film, a silicon nitride film, and a compound film of silicon oxide and silicon nitride.

19. The method of claim 16 further comprising the steps of:

removing the side walls after the impurity regions and the LDD region are formed; and performing a laser annealing with the impurity region and the LDD regions.

20. The method of claim 16 wherein the impurity regions has source and drain regions.

21. The method of claim 20 wherein the LDD regions are formed between the source and drain regions.

22. The method of claim 16 wherein a concentration of the impurity for the first introducing is lower than than for the second introducing.

23. A method for forming a thin film transistor, comprising the steps of:

forming a semiconductor film on an insulating surface;

forming a gate insulating film which having a first etching rate on the semiconductor film;

forming a gate electrode on the gate insulating film;

forming impurity regions by introducing an impurity into the semiconductor film using the gate electrode as a first mask;

forming side walls having a second etching rate, which is larger than the first etching rate, in contact with sides of the gate electrode;

forming LDD regions by introducing the impurity into the impurity regions using the side walls as a second mask;

removing the side walls after forming the LDD regions; and performing a laser annealing with the impurity region and the LDD regions, wherein said side walls comprise an amorphous semiconductive silicon.

24. The method of claim 23 wherein a material of the gate electrode is selected from the group consisting of tantalum, titanium, and aluminum.

* * * * *